United States Patent
Kim et al.

(10) Patent No.: US 9,978,592 B2
(45) Date of Patent: May 22, 2018

(54) METHOD FOR REPAIRING OXIDE THIN FILM AND OXIDE THIN-FILM DEVICE

(71) Applicant: Industry-Academic Cooperation Foundation, Yonsei University, Seoul (KR)

(72) Inventors: Hyun Jae Kim, Seoul (KR); Young Jun Tak, Seoul (KR); Si Joon Kim, Seoul (KR); Seokhyun Yoon, Seoul (KR)

(73) Assignee: Industry-Academic Cooperation Foundation, Yonsi University, Seoul (KR)

( * ) Notice: Subject to any disclaimer, the term of this patent is extended or adjusted under 35 U.S.C. 154(b) by 0 days. days.

(21) Appl. No.: 15/096,556

(22) Filed: Apr. 12, 2016

(65) Prior Publication Data
US 2016/0308034 A1 Oct. 20, 2016

(30) Foreign Application Priority Data
Apr. 14, 2015 (KR) ........................ 10-2015-0052497

(51) Int. Cl.
*H01L 29/66* (2006.01)
*H01L 21/02* (2006.01)
*H01L 29/22* (2006.01)
*H01L 29/24* (2006.01)

(52) U.S. Cl.
CPC .. *H01L 21/02631* (2013.01); *H01L 21/02381* (2013.01); *H01L 21/02472* (2013.01); *H01L 21/02483* (2013.01); *H01L 21/02488* (2013.01); *H01L 21/02554* (2013.01); *H01L 21/02565* (2013.01); *H01L 21/02628* (2013.01); *H01L 21/02658* (2013.01); *H01L 21/02664* (2013.01); *H01L 29/22* (2013.01); *H01L 29/24* (2013.01)

(58) Field of Classification Search
CPC ......... H01L 29/66969; H01L 21/02381; H01L 21/02658; H01L 21/02623–21/02628; H01L 21/02488; H01L 21/02483; H01L 21/02472; H01L 21/02664; H01L 29/22; H01L 21/02631; H01L 21/02565
See application file for complete search history.

(56) References Cited

U.S. PATENT DOCUMENTS

| | | | |
|---|---|---|---|
| 6,420,193 B1 | 7/2002 | Martin | |
| 7,208,418 B1 * | 4/2007 | Okada | H01L 21/76831 257/E21.579 |
| 2001/0022399 A1 * | 9/2001 | Koubuchi | G03F 9/7076 257/758 |
| 2003/0013211 A1 * | 1/2003 | Hu | H01L 21/31053 438/4 |
| 2009/0085173 A1 * | 4/2009 | Boemmels | H01L 21/76814 257/635 |

FOREIGN PATENT DOCUMENTS

| | | |
|---|---|---|
| JP | H06-333826 A | 12/1994 |
| JP | 2005-142521 A | 6/2005 |
| KR | 2001-0060988 A | 7/2001 |
| KR | 2003-0000411 A | 1/2003 |
| KR | 2013-0143420 A | 12/2013 |

* cited by examiner

*Primary Examiner* — Cuong B Nguyen
(74) *Attorney, Agent, or Firm* — Harness, Dickey & Pierce, P.L.C.

(57) ABSTRACT

Disclosed is a method for repairing an oxide thin film, including repairing the oxide thin film by forming a repairing material that contains an oxide at a defect of the oxide thin film.

8 Claims, 8 Drawing Sheets

METHOD FOR REPAIRING OXIDE THIN FILM AND OXIDE THIN-FILM DEVICE

CROSS-REFERENCE TO RELATED APPLICATIONS

A claim for priority under 35 U.S.C. § 119 is made to Korean Patent Application No. 10-2015-0052497 filed Apr. 14, 2015, in the Korean Intellectual Property Office, the entire contents of which are hereby incorporated by reference.

BACKGROUND

Embodiments of the inventive concept described herein relate to a method for repairing an oxide thin film and an oxide thin-film device.

An oxide semiconductor with a channel layer formed of a metal-oxide thin film highly interests the industry as a substitute for a Si-based semiconductor. In the tendency, many studies are going on material and structural improvement for higher yields of oxide semiconductors and on enhancement of device characteristics and reliability through diverse post-processing techniques.

However, improving yields of oxide semiconductors requires technology for solving defects of oxide thin film in addition to enhancement of reliability and reproducibility of devices themselves. Oxide semiconductors with defects are generally disused after a test, decreasing yields of such oxide semiconductors.

SUMMARY

Embodiments of the inventive concept provide a method for repairing an oxide thin film, and an oxide thin-film device with a repaired oxide thin film, capable of allowing the oxide thin film to have electrical characteristics and reliability nearby to good product quality.

Embodiments of the inventive concept further provide a method for repairing an oxide thin film in lower cost.

Directions of the inventive concepts may not be restrictive to the aforementioned technical subjects and even other technical subjects not mentioned may be comprehensible from the following description by those skilled in the art.

In accordance an aspect of the inventive concept, a method for repairing an oxide thin film may include repairing the oxide thin film by forming a repairing material that contains an oxide in a defective part of the oxide thin film.

In an embodiment, the defective part may include a region that is different from another region in electrical characteristics of the oxide thin film.

In an embodiment, the repairing of the oxide thin film may include flattening the defective part by removing a projection of the defective part, and forming the repairing material in the flattened defective part.

In an embodiment, the repairing of the oxide thin film may include forming a first repairing material by injecting a repairing solution, which contains a first oxide, into the defective part, and repairing the oxide thin film by depositing a second repairing material, which contains a second oxide, on the defective part in which the first repairing material is formed.

In an embodiment, the repairing of the oxide thin film may include depositing a first repairing material, which contains a first oxide, in the defective part, and forming a second repairing material by injecting a repairing solution, which contains a second oxide, into the defective part on which the first repairing material is deposited.

In an embodiment, the repairing of the oxide thin film may include forming a repairing layer by forming the repairing material in the defective part of the oxide thin film, and equalizing the repairing layer with the oxide thin film in surface level by processing a surface of the repairing layer.

In an embodiment, the repairing of the oxide thin film may include disposing a protection film, which has an opening of a pattern corresponding to a shape of the defective part, on the oxide thin film, and forming the repairing material in the defective part through the opening.

In an embodiment, the repairing material may include at least one of ZnO, InO, SnO, InZnO, InGaO, ZnSnO, and InGaZnO.

In an embodiment, the repairing of the oxide thin film may include forming a repairing solution, which contains the repairing material, in the defective part.

In an embodiment, the oxide thin film may be deposited through a vacuum process.

In an embodiment, the method may further include preparing the repairing solution by dissolving at least one of indium precursors, zinc precursors, and gallium precursors in a solvent.

In an embodiment, the preparing of the repairing solution may include preparing the repairing solution by adjusting molar concentration of the repairing solution according to a thickness of the defective part.

In an embodiment, the repairing of the oxide thin film may include spreading the repairing solution in the defective part through a process of spin coating, inkjet printing, spray coating, or deep coating.

In an embodiment, the repairing of the oxide thin film may include thermally processing the repairing solution, which is spread in the defective part, at temperature of 200 to 400° C.

In an embodiment, the thermally processing may be performed for 1 to 2 hours.

In an embodiment, the repairing of the oxide thin film may include depositing the repairing material in the defective part.

In an embodiment, the depositing of the repairing material may include depositing the repairing material in the defective part through a process of chemical vapor deposition (CVD), atomic layer deposition (ALD), or sputtering.

In an embodiment, the repairing of the oxide thin film may include thermally processing the repairing solution, which is spread in the defective part, at temperature of 200 to 400° C.

In an embodiment, the depositing of the repairing material may include depositing the repairing material by adjusting a deposition processing time according to a thickness of the defective part.

In accordance with another aspect of the inventive concept, an oxide thin-film device may include a substrate, and an oxide thin film on the substrate, wherein the oxide thin film comprises a repairing layer, and wherein the oxide thin film and the repairing layer may be same in composition but different in density.

In an embodiment, the oxide thin film and the repairing layer may be same in composition but different in density.

In an embodiment, the repairing material may contain at least one of ZnO, InO, InZnO, InGaO, ZnSnO, and InGaZnO.

In an embodiment, an electrode may be further included on the oxide thin film.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Other aspects, advantages, and salient features of the inventive concept will become apparent to those skilled in the art from the following detailed embodiments. Various embodiments described herein, however, may not be intentionally confined in specific embodiments, but should be construed as including diverse modifications, equivalents, and/or alternatives. Various embodiments are merely provided to help those skilled in the art to clearly understand the technical scope of the present disclosure and the present disclosure may be only defined by the scope of the annexed claims.

Unless otherwise defined herein, all the terms used herein (including technical or scientific terms) may have the same meaning that is generally acceptable by universal technology in the related art of the present disclosure. It will be further understood that terms, which are defined in a dictionary and commonly used, may also be interpreted as is customary in the relevantly related art and/or as is same in the description of the inventive concept. Even in the case of terminological expression with insufficient clarification, such terms may not be conceptualized or overly interpreted in formality. Therefore, the terms used in this specification are just used to describe various embodiments of the present disclosure and may not be intended to limit the scope of the inventive concept.

In the description, the terms of a singular form may also include plural forms unless otherwise specified. The terms 'include' and/or its diverse inflections or conjugations, for example, 'inclusion', 'including', 'includes', or 'included', as used herein, may be construed such that any one of a constitution, a component, an element, a step, an operation, and/or a device does not exclude presence or addition of one or more different constitutions, components, elements, steps, operations, and/or devices. Additionally, the term 'comprise' should be also interpreted as such.

A method for repairing an oxide thin film according to an embodiment of the inventive concept may repair the oxide thin film by forming a repairing material which includes an oxide in a defective part of the oxide thin film. For example, an oxide thin film and a repairing material may be oxide semiconductors same in composition.

A defective part may mean a hollow region which is collapsed from the surface of an oxide thin film. For example, a defective part may means a physically defective part including holes, grooves, or scratches on an oxide thin film. Additionally, a defective part may also include a functionally defective part of an oxide thin film. As an example, the defective part may mean a region which is different from other regions in electrical characteristics. A defective part may mean a region with electrical characteristics different from a specific reference in an oxide thin film. As an example, in the case that the oxide thin film is implemented in an oxide thin-film transistor, the defective part may include a region whose threshold voltage is out of a reference value, or whose on/off current is lower or higher than a reference value.

A repairing material may be a material which fills up the defective part to recover a surface defect of the oxide thin film. 'Repair' may mean forming the repairing material in a defective part on the oxide thin film.

As an embodiment, a repairing material formed in a defective part of the oxide thin film may be an oxide formed through a vacuum process or through a solution process.

In the case of repairing an oxide thin film through a vacuum process, it may be allowable to improve the electrical characteristics and reliability of an oxide semiconductor device. In the case of repairing an oxide thin film through a solution process, it may be accomplishable to repair the oxide thin film in lower cost.

According to an embodiment, it may be practicable to repair a defective part of an oxide thin film, which is deposited by a vacuum process, through a solution process. Accordingly, it may be allowable to repair an oxide thin film in lower cost as well as in higher electrical characteristics and reliability thereof.

As an embodiment, for effectively repairing an oxide thin film and improving electrical characteristics of an oxide thin-film device, the oxide thin film may be repaired by forming a repairing material in a defective part of the oxide thin film after flattening the defective part of the oxide thin film, by flattening the surface of a repairing layer after forming the repairing layer with a repairing material in a defective part, or by cooperatively executing a vacuum process and a solution process.

Hereafter, embodiments of the inventive concept will be described in conjunction with the accompanied figures.

Figure 1:
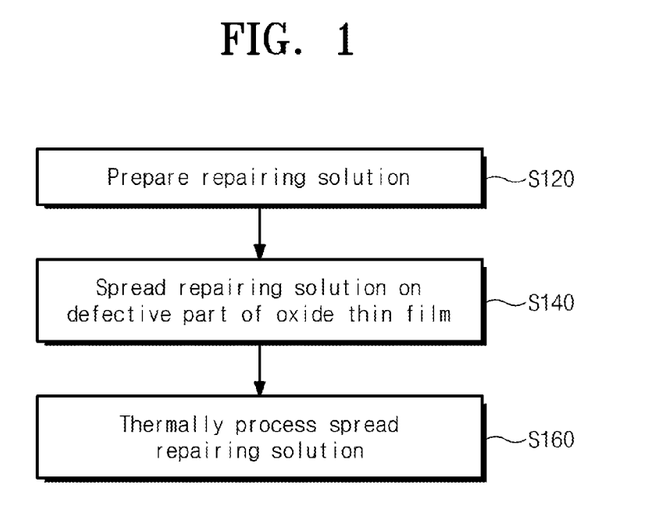
FIG. 1 is a flow chart showing a method for repairing an oxide thin film through a solution process according to an embodiment of the inventive concept.
Figure 2:
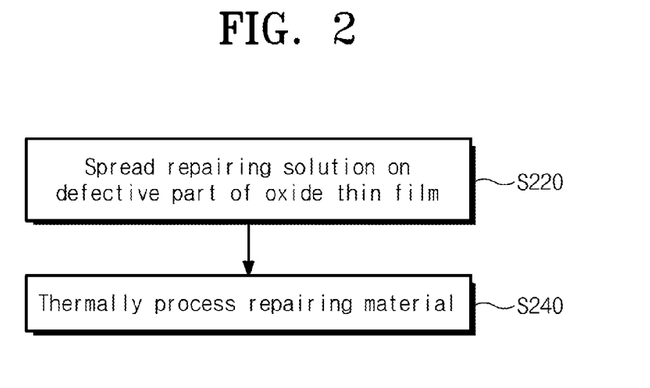
FIG. 2 is a flow chart showing a method for repairing an oxide thin film through a vacuum process according to an embodiment of the inventive concept.

FIGS. 1 and 2 are flow charts showing a method for repairing an oxide thin film through a solution process according to an embodiment of the inventive concept.

FIG. 1 is a flow chart showing a method for repairing an oxide thin film through a vacuum process according to an embodiment of the inventive concept.

Referring to FIG. 1, a method for repairing an oxide thin film through a solution process may include steps of preparing a repairing solution (S120), spreading the repairing solution in a defective part of the oxide thin film (S140), and thermally processing the spread repairing solution (S160).

In the step S120 of preparing the oxide thin-film repairing solution, the repairing solution may be prepared containing an oxide by dissolving at least one of indium precursors, zinc precursors, gallium precursors, and tin precursors in a solvent.

As an embodiment, the repairing solution may be prepared by adjusting its molar concentration in accordance with a thickness of a defective part of an oxide thin film. A thickness of a repairing layer formed in a defective part of an oxide thin film increases in proportion to molar concentration of a repairing solution. Accordingly, a repairing layer may be formed in the same thickness with a defective part of an oxide thin film by adjusting molar concentration of a repairing solution, according to the thickness of the defective part of the oxide thin film, to adjust the thickness of the repairing layer formed in defective part.

The step S140 of spreading a repairing solution in a defective part of the oxide thin film may include a step of spreading the repairing solution in the defective part of the oxide thin film through a process of spin coating, inkjet printing, spray coating, or deep coating. As an example, in the case of spreading a repairing solution through an inkjet printing process, the repairing solution may be selectively spread in a defective part of an oxide thin film.

In the step S160 of thermally processing the repairing solution, the repairing solution may be thermally processed in the defective part of the oxide thin film under temperature 200 to 400° C. The thermal processing may be performed for 1 to 2 hours. That is, in the case of repairing an oxide thin film through a solution process, it may be permissible to repair the oxide thin film under low temperature of 200 to 400° C., different from the case of forming an oxide thin film (thermal processing with high temperature equal to or higher than 450° C.).

FIG. 2 is a flow chart showing a method for repairing an oxide thin film through a vacuum process according to another embodiment of the inventive concept.

As shown in FIG. 2, the method for repairing an oxide thin film through a vacuum process may include steps of depositing a repairing material in a defective part of the oxide thin film (S220), and thermally processing the deposited repairing material (S240).

In the step S220 of depositing a repairing material in a defective part of the oxide thin film, the repairing material may be deposited in the defective part through a process of Chemical Vapor Deposition (CVD), Atomic Layer Deposition (ALD), or sputtering.

In the step S140 of thermally processing the repairing material, the repairing material deposited in the defective part may be thermally processed under 200 to 400° C.

According to an embodiment, an oxide thin film may be repaired through a low-temperature thermal process.

Figure 3A:
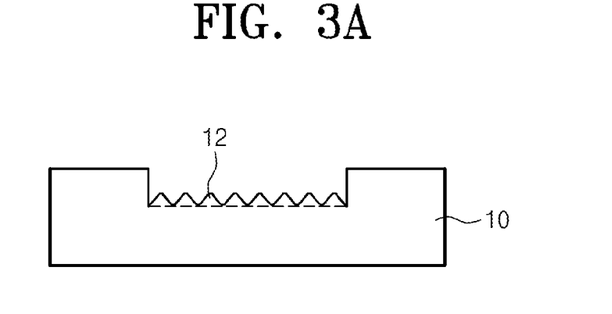
FIGS. 3A to 3C are sectional diagrams illustrating a method for repairing an oxide thin film according to an embodiment of the inventive concept.
Figure 3B:
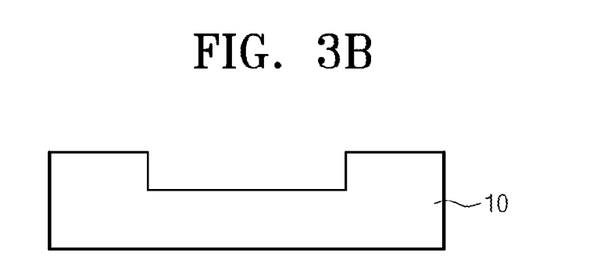
Figure 3C:
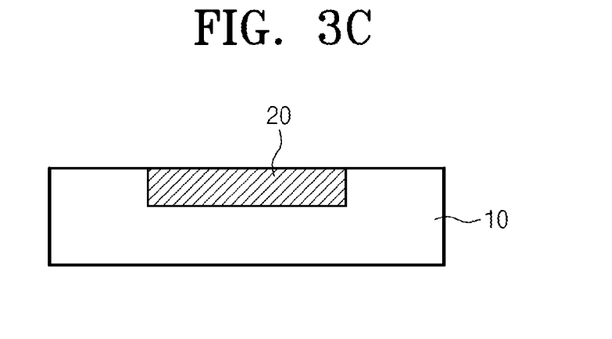

FIGS. 3A to 3C are sectional diagrams illustrating a method for repairing an oxide thin film according to an embodiment of the inventive concept.

As illustrated in FIG. 3A, in the case that there is a defect in an oxide thin film 10, the defect is generally rugged, accompanying projections 12.

The projections 12 may mean a part relatively protruding from the bottom of the defective part. In an embodiment, the projections 12 may mean a region leveled higher than a virtual reference plane which is determined between the highest point and the lowest point on the rugged bottom.

In the case of a repairing material through a vacuum process, an oxide thin film may be deposited in superior electrical characteristics. However, in the case of using a vacuum process to deposit a repairing material on a defective part having projections, the repairing material may be deposited corresponding to a shape of the defective part because the repairing material is formed with a uniform thickness on the defective part. Additionally, in the case of using a vacuum process to deposit a repairing material on a defective part having projections, a repaired oxide thin film may be degraded in electrical characteristics because the repairing material is not uniformly deposited on the defective part.

Therefore, as illustrated in FIG. 3B, the defective part of the oxide thin film may be flattened by removing the projections through etching or laser processing.

After then, as illustrated in FIG. 3C, the oxide thin film may be repaired by uniformly depositing a repairing material 20 on the flattened defective part through a vacuum process.

Figure 4A:
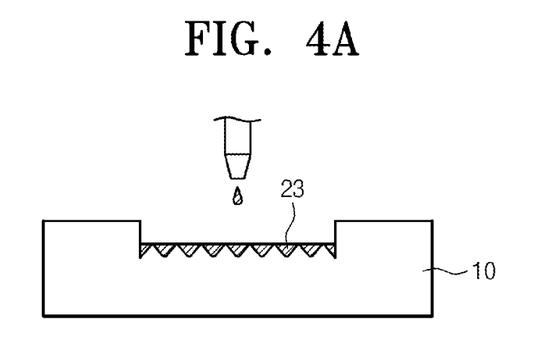
FIGS. 4A to 4C are sectional diagrams illustrating a method for repairing an oxide thin film according to another embodiment of the inventive concept.
Figure 4B:
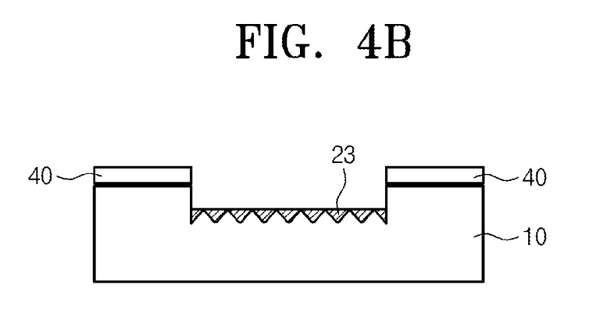
Figure 4C:
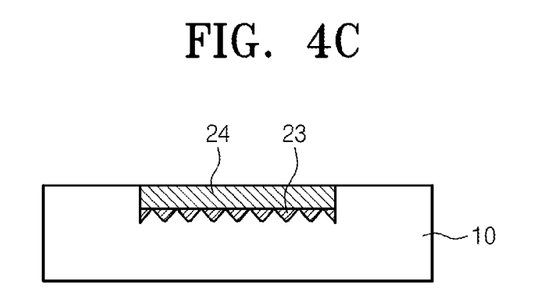

FIGS. 4A to 4C are sectional diagrams illustrating a method for repairing an oxide thin film according to another embodiment of the inventive concept.

As illustrated in FIG. 4A, A defective part having projections may be flattened by spreading a repairing solution through a solution process to form a first repairing material 23 on a level higher than the surface level of the projections. In the case of flattening a defective part through a solution process, projections may be flattened in lower cost because there is no need of employing additional etching or laser equipment.

Then, as illustrated in FIG. 4B, for preventing the repairing material from being deposited in other parts out of the defective part, a protection film 40 having an opening of a pattern corresponding to a shape of the defective part. As an example, a protection film may have an opening in various forms corresponding to various shapes of defective parts.

Then, as illustrated in FIG. 4C, the defective oxide thin film may be repaired to have superior electrical characteristics by uniformly depositing a second repairing material through a vacuum process.

Figure 5A:
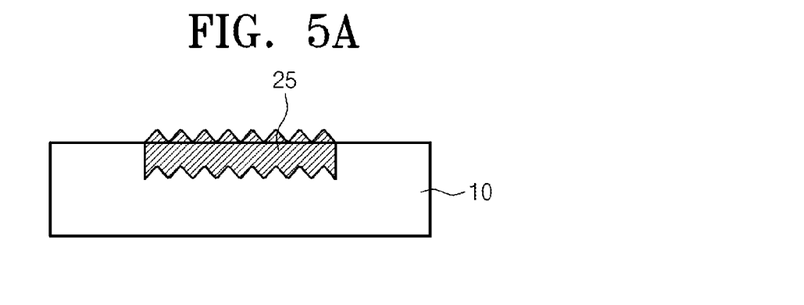
FIGS. 5A to 5B are sectional diagrams illustrating a method for repairing an oxide thin film according to still another embodiment of the inventive concept.
Figure 5B:
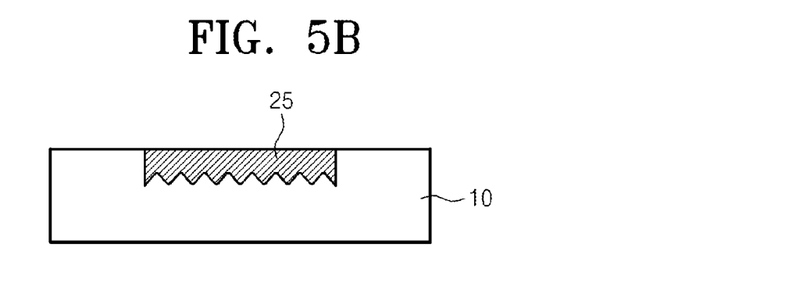

FIGS. 5A to 5B are sectional diagrams illustrating a method for repairing an oxide thin film according to still another embodiment of the inventive concept.

As illustrated in FIG. 5A, a repairing material may be deposited on a defective part of an oxide thin film 10 to form a repairing layer 25. In this case, the repairing material may be deposited on the defective part, which has projections, through ALD. In the case of depositing a repairing material on a defective part through ALD, the repairing material may be uniformly deposited even without a process of flattening the defective part having projections. Accordingly, it may shorten a processing time.

Then, as illustrated in FIG. 5B, the surface of the repairing layer 25 may be processed to match a surface level of the repairing layer with a surface level of the oxide thin film 10. As an example, the surface of the repairing layer may be equalized to the surface level of the oxide thin film through etching or laser processing.

Figure 6A:
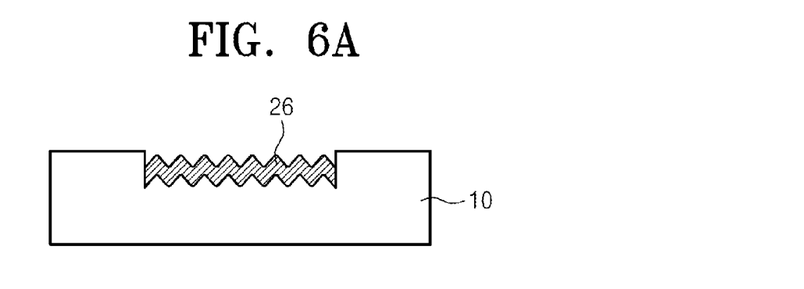
FIGS. 6A to 6B are sectional diagrams illustrating a method for repairing an oxide thin film according to further still another embodiment of the inventive concept.
Figure 6B:
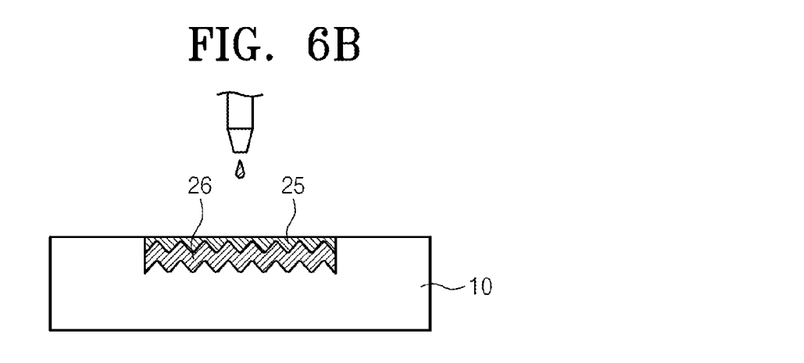

FIGS. 6A to 6B are sectional diagrams illustrating a method for repairing an oxide thin film according to further still another embodiment of the inventive concept.

As illustrated in FIG. 6A, a first repairing material 26 containing a first oxide may be deposited on a defective part of an oxide thin film 10 through a vacuum process. In this case, the first repairing material 26 deposited through a vacuum process may be deposited at a level lower than or equal to a surface level of the oxide thin film 10.

Then, as illustrated in FIG. 6B, a second repairing solution containing a second oxide may be injected to form a second repairing material 26 on a level equal to the surface level of the oxide thin film. Accordingly, a defective oxide thin film may be repaired in lower cost because additional etching equipment does not need for processing the surface of a repairing material which is deposited on a level higher than a surface level of the oxide thin film.

As an embodiment, the first oxide and the second oxide may be same with the oxide thin film in composition. Additionally, the first repairing material and the second repairing material may be also same with the oxide thin film in composition.

Figure 7:
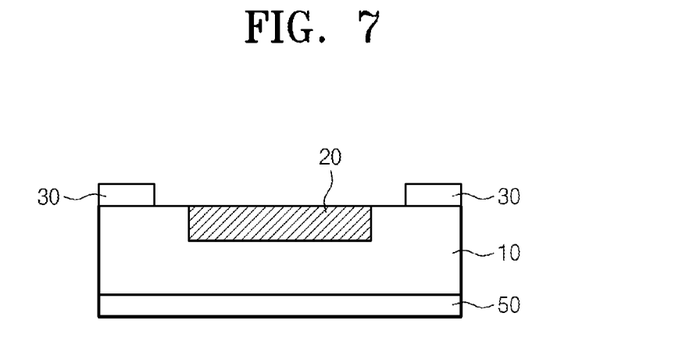
FIG. 7 is a sectional diagram illustrating an oxide thin film 100 including a repaired oxide thin film 10 according to an embodiment of the inventive concept.

FIG. 7 is a sectional diagram illustrating an oxide thin film 100 including a repaired oxide thin film 10 according to an embodiment of the inventive concept.

As illustrated in FIG. 7, an oxide thin-film device according to an embodiment of the inventive concept may include a substrate 50, and the oxide thin film 10 on the substrate 50. The oxide thin film may include a repairing layer containing a repairing material 20. As an embodiment, an electrode 30 may be further included on the oxide thin film. The repairing layer may include a repairing material for repairing a defective part of the oxide thin film. The repairing material may contain an oxide. As an example, the oxide thin film and the repairing layer may be same in composition but different in density. Due to a difference of density between an oxide thin film and a repairing layer, tensile and compressive stress may be generated in a channel layer during a thermal process to allow strain in the channel layer, thus improving electrical characteristics of an oxide thin-film device. As an embodiment, the repairing material may contain at least one of ZnO, InO, SnO, InZnO, InGaO, ZnSnO, and InGanO.

Hereafter, a method for repairing an oxide thin film according to the inventive concept may be further described with various embodiments. It can be seen of repairing effects from experimental results between respective Embodiments and Comparisons.

Embodiment 1

This embodiment was made from an experiment with assumption that an oxide thin film of 40 nm has a defective part with the thickness of 30 nm. Accordingly, to skip a process of removing the defective part of 30 nm from the oxide thin film of 40 nm, an In—Ga—Zn—O (IGZO) oxide thin film was deposited in 10 nm through a vacuum process.

First, after supersonically washing a silicon (Si) substrate, on which silicon oxide ($SiO_2$) was grown, in the sequence of acetone and methanol respectively for 10 min, a nitrogen gun was used to blur the substrate and to remove particles from the surface of the substrate.

Afterward, a sputtering process was executed to form an IGZO oxide thin film of 10 nm by processing a sputtering target, which had a ratio of $In_2O_3:Ga_2O_3:ZnO$ that is 1:1:1, for about 1 min at power of 150 W under the atmosphere of argon gas with partial pressure of 5 mTorr.

Then, a repairing material of 30 nm was deposited on the oxide thin film. In detail, a repairing material containing IGZO oxide was deposited in the same with the process of depositing the ICZO oxide thin film of 10 nm, but processing a target, which had a ratio of $In_2O_3:Ga_2O_3:ZnO$ that is 1:1:1, for about 4 min at power of 150 W under the atmosphere of argon gas with partial pressure of 5 mTorr. Then, the deposited repairing material was thermally processed for 30 min at 300° C.

<Comparison 1>

To find a repairing effect from a repaired oxide thin film according to embodiments of the inventive concept, an unrepaired oxide thin film, i.e., a good oxide thin film, was manufactured without a defective part.

An IGZO oxide thin film of 40 nm was formed in the same with the process of depositing the oxide thin film of 10 nm of Embodiment 1, but adjusting a deposition time of a sputter to 5 min.

The following figures are graphs for ascertaining electrical characteristics and reliability of oxide thin-film transistors including oxide thin films according to Embodiment or Comparison of the inventive concept, showing a variation of drain current (ID) along a gate voltage (VG) of the oxide thin-film transistor.

Figure 8:
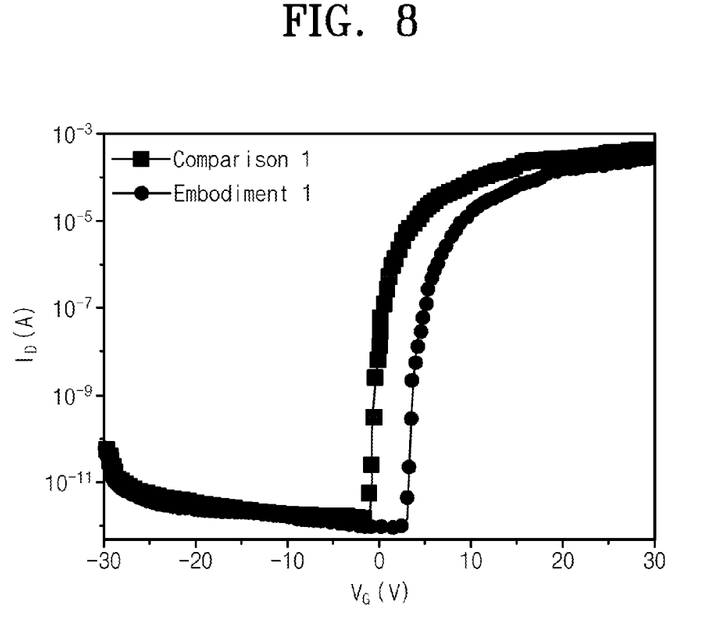
FIG. 8 is a graphic diagram comparatively showing transfer characteristics of an oxide thin-film transistor including a repaired oxide thin film according to Embodiment 1, and of an oxide thin-film transistor including a good oxide thin film according to Comparison 1.

FIG. 8 is a graphic diagram comparatively showing transfer characteristics of an oxide thin-film transistor including a repaired oxide thin film according to Embodiment 1, and of an oxide thin-film transistor including a good oxide thin film according to Comparison 1.

From FIG. 8, it can be seen that in the case for an oxide thin film according to Embodiment 1, the electrical characteristics are almost similar to those of a good oxide thin film according to Comparison 1, but the threshold voltage slightly shifts more than that of the good oxide thin film of Comparison 1. That is, even for an oxide thin-film transistor including a repaired oxide thin film according to Embodiment 1, it can be seen that an on/off current clearly appears at a threshold voltage and a slope equal to or lower than the threshold voltage is almost identical to that of Comparison 1.

Figure 9A:
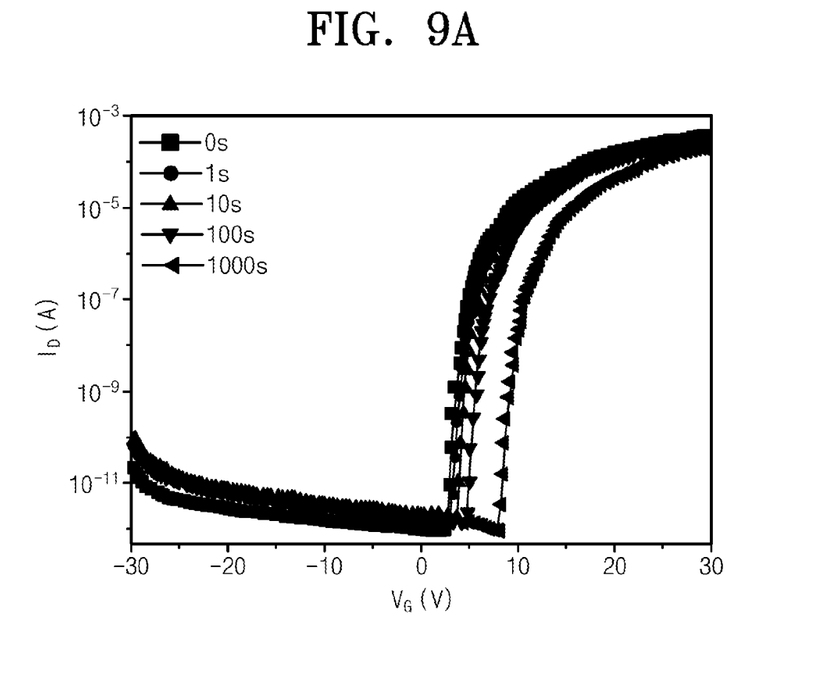
FIGS. 9A and 9B are graphic diagrams comparatively showing Positive Bias Stress (PBS) test results from an oxide thin-film transistor including a repaired oxide thin film according to Embodiment 1, and from an oxide thin-film transistor including a good oxide thin film according to Comparison 1.
Figure 9B:
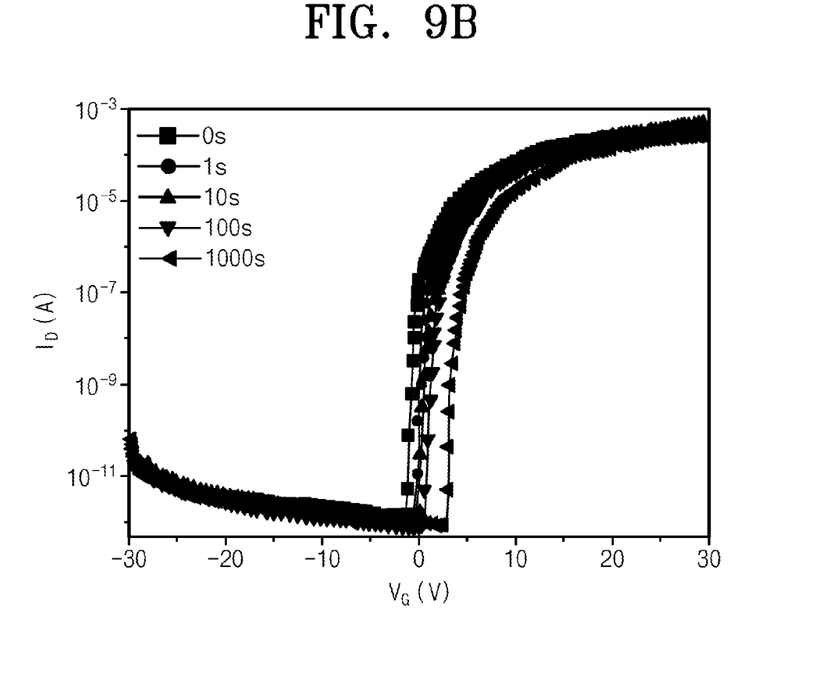

FIGS. 9A and 9B are graphic diagrams comparatively showing Positive Bias Stress (PBS) test results from an oxide thin-film transistor including a repaired oxide thin film according to Embodiment 1, and from an oxide thin-film transistor including a good oxide thin film according to Comparison 1.

Referring to FIGS. 9A and 9B, the reliability of a device may be ascertained from a variation of a threshold voltage after 1, 10, 100, and 1000 sec since a voltage is applied to each oxide thin-film transistor. Comparing FIG. 9A with FIG. 9B, it can be seen that the good oxide thin film according to Comparison 1 is almost similar to the repaired oxide thin film according to Embodiment 1 in variation of threshold voltage. Accordingly, even the repaired oxide thin film according to Embodiment 1 may be superior in stability and reliability.

Embodiment 2

An IGZO oxide thin film of 10 nm was formed through the same process with Embodiment 1.

After then, a repairing material of 30 nm was formed on the oxide thin film through a solution process.

In detail, a repairing solution with molar concentration of 0.3 M was prepared by dissolving indium nitrate ($In(NO_3)_3$), zinc nitrate ($N(NO_3)_2$), and gallium nitrate ($Ga(NO_3)_3$) respectively with indium precursors and zinc precursors in a solvent of 2-methoxyethanol. During this, a molar ratio among indium, gallium, and zinc was set to In:Ga:Zn=2:2:1 and a nitric acid of 0.06 g was added thereto per 1 ml of 2-methoxyethanol.

Then, the repairing solution was spin-coated on the oxide thin film of 10 nm. After thermally processing the substrate, on which the repairing solution was spread, for 5 min at 100° C., the substrate was thermally post-processed for 2 hours at 300° C. Thereby, a repairing material containing IGZO oxide of 30 nm was formed on the oxide thin film of 10 nm.

<Comparison 2>

Comparison 2 was executed to comparatively show whether the semiconductor characteristics of an oxide thin film well resulted from a low-temperature thermal process like Embodiment 2 even in the case of forming an oxide thin film through a solution process, not in the case of repairing an oxide thin film, which is deposited by a vacuum process, through a solution process like Embodiment 2.

Under the same condition with the repairing through a solution process in Embodiment 2, an oxide thin film of 40 nm was formed on a substrate through a solution process.

In detail, after supersonically washing a silicon (Si) substrate, on which silicon oxide ($SiO_2$) was grown, in the sequence of acetone and methanol respectively for 10 min, a nitrogen gun was used to blur the substrate and to remove particles from the surface of the substrate.

Then, a repairing solution with molar concentration of 0.4 M was prepared by dissolving indium nitrate ($In(NO_3)_3$), zinc nitrate ($N(NO_3)_2$), and gallium nitrate ($Ga(NO_3)_3$) respectively with indium precursors and zinc precursors in a solvent of 2-methoxyethanol. During this, a molar ratio among indium, gallium, and zinc was set to In:Ga:Zn=2:2:1 and a nitric acid of 0.06 g was added thereto per 1 ml of 2-methoxyethanol.

Afterward, the repairing solution was spin-coated on the substrate and thermally processed, under the same condition with Embodiment 2, to form an oxide thin film of 40 nm.

Figure 10A:
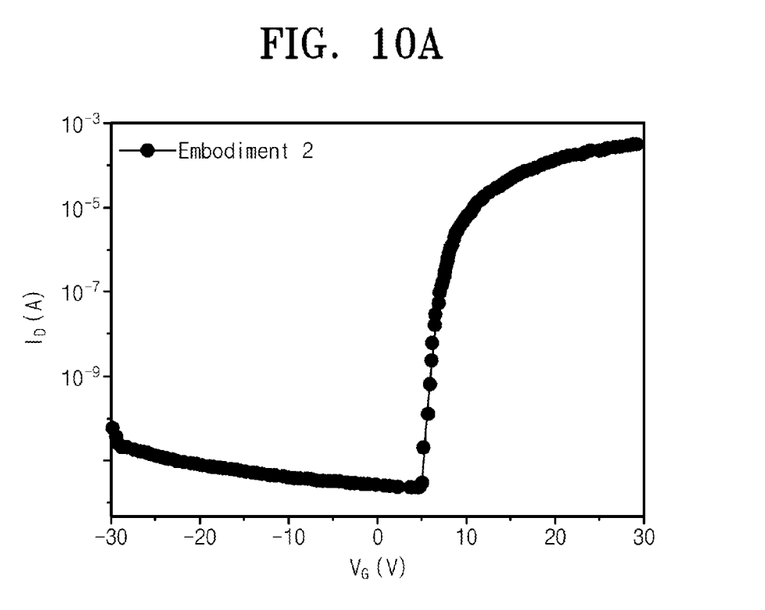
FIGS. 10A and 10B are a graphic diagram comparatively showing transfer characteristics of an oxide thin-film transistor including a repaired oxide thin film according to Embodiment 2, and of an oxide thin-film transistor including a superior oxide thin film according to Comparison 2.
Figure 10B:
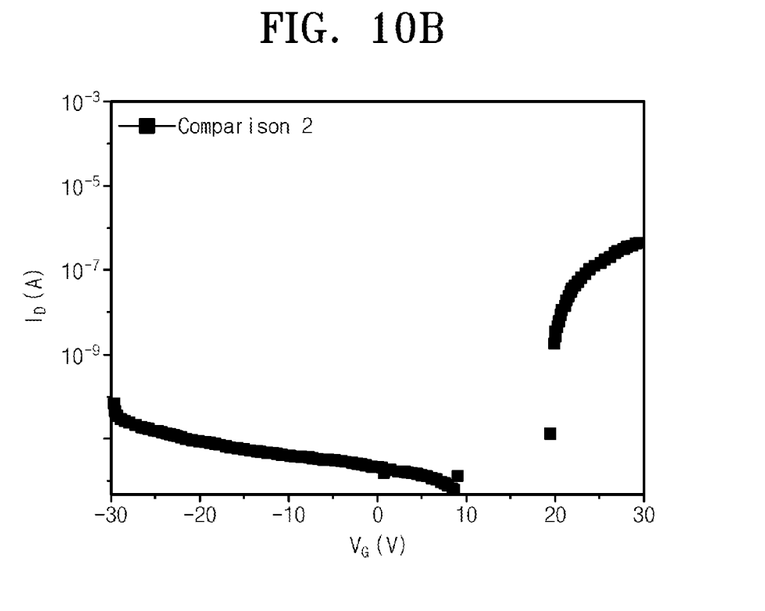

FIGS. 10A and 10B are a graphic diagram comparatively showing transfer characteristics of an oxide thin-film transistor including a repaired oxide thin film according to Embodiment 2, and of an oxide thin-film transistor including a superior oxide thin film according to Comparison 2.

As shown in FIGS. 10A and 10B, it can be seen that a transistor including an oxide thin film according to Embodiment 2 is easily exhibited in transfer characteristics but a transistor including an oxide thin film according to Comparison 2 is hardly exhibited in transfer characteristics. Therefore, it can be seen that an effect of the repairing method according to Embodiment 2 is superior to that according to Comparison 2. Additionally, in the case of forming an oxide thin film through a solution process like Comparison 2, a low-temperature thermal process is insufficient to exhibit semiconductor characteristics. But in the case of repairing an oxide thin film, which is deposited by a vacuum process, through a solution process, even a low-temperature thermal process is sufficient to exhibit semiconductor characteristics.

Figure 11:
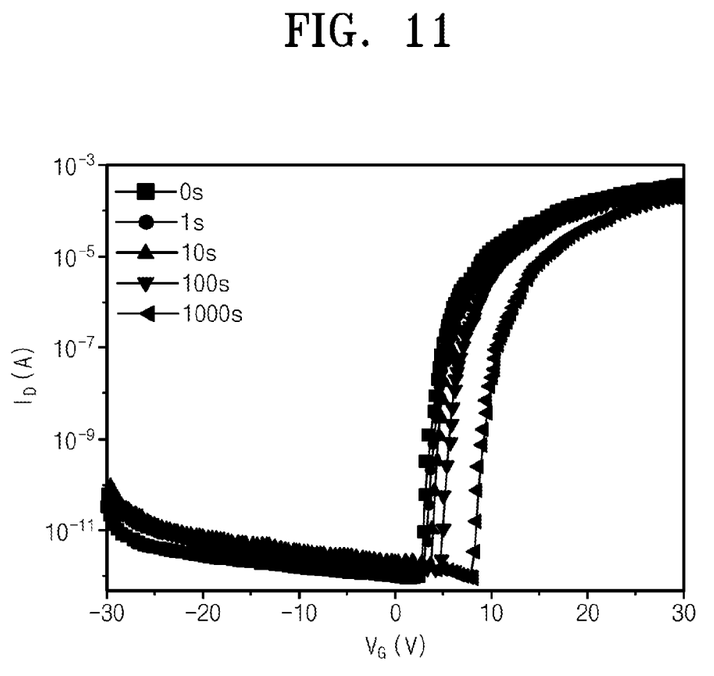
FIG. 11 is a graphic diagram showing a PBS test result from an oxide thin-film transistor including a repaired oxide thin film according to Embodiment 2.

FIG. 11 is a graphic diagram showing a PBS test result from an oxide thin-film transistor including a repaired oxide thin film according to Embodiment 2.

Referring to FIG. 11, it can be seen that an oxide thin film according to Embodiment 2 is similar to a good oxide thin film according to Comparison 1 in variation of threshold voltage. Therefore, it can be seen that even an oxide thin film repaired through a solution process according to Embodiment 2 of the inventive concept is superior in stability and reliability.

Additionally, as results of measuring mobility of oxide thin-film transistors including oxide thin films according to Comparison 1, Embodiment 1, and Embodiment 2, Comparison 1 resulted in mobility of 9.2 $cm^2$/VS, Embodiment 1 resulted in mobility of 8.35 cm2/VS, and Embodiment 2 resulted in mobility of 10.24 cm2/VS. Therefore, a repaired oxide thin film according to Embodiment 2 is more improved than a good oxide thin film according to Comparison 1 in mobility.

The above description is about a method for repairing a defect of an oxide thin film through a vacuum process or through a solution process, and about a semiconductor device including a repaired oxide thin film.

According to embodiments of the inventive concept, it may be allowable to provide the electrical characteristics and reliability, similar to those of a good oxide thin film, by repairing an oxide thin film. Additionally, a low-temperature thermal process may be available for repairing an oxide thin film through a solution process, thus reducing cost in repairing a defective oxide thin film.

According to an embodiment of the inventive concept, it may be allowable to repair a defective oxide thin film toward the electrical characteristics and reliability of superior product quality.

According to another embodiment of the inventive concept, it may be accomplishable to repair an oxide thin film in lower cost.

Advantageous effects of the inventive concept may not be restrictive to the aforementioned and other effects not mentioned may be clearly comprehensible from the descriptive specification and the accompanied figures by those skilled in the art.

While embodiments of the inventive concept have been shown and described with reference to the accompanying drawings thereof, it will be understood by those skilled in the art that various changes and modifications in form and details may be made therein without departing from the spirit and scope of the inventive concept as defined by the appended claims and their equivalents. For example, it may be allowable to achieve the desired results although the embodiments of the inventive concept are preformed in dispersed forms with the elements disclosed on the embodiments of the inventive concept, or in combinational forms with the elements. Therefore, the technical scope of the inventive concept should be almost defined by the inventive concept of the appended claims, but without literally restrictive to the claims, and should be construed as including other implementations, other embodiments, and equivalents of the appended claims.

What is claimed is:

1. A method of repairing an oxide thin film, the method comprising:
   preparing a repairing solution by dissolving at least one selected from indium precursors, zinc precursors, and gallium precursors in a solvent; and
   repairing the oxide thin film by forming a repairing material including an oxide on a defective part of the oxide thin film using the repairing solution.

2. The method of claim 1, wherein the defective part includes a region that is different from another region in electrical characteristics of the oxide thin film.

3. The method of claim 1, wherein the repairing of the oxide thin film includes:
forming a first repairing material by injecting the repairing solution, which comprises a first oxide, into the defective part; and
repairing the oxide thin film by depositing a second repairing material, which comprises a second oxide, on the defective part in which the first repairing material is formed.

4. The method of claim 1, wherein the repairing of the oxide thin film includes:
disposing a protection film, which has an opening of a pattern corresponding to a shape of the defective part, on the oxide thin film; and
forming the repairing material on the defective part through the opening.

5. The method of claim 1, wherein the repairing of the oxide thin film includes:
forming the repairing solution, which contains the repairing material, on the defective part.

6. The method of claim 5, wherein the oxide thin film is deposited through a vacuum process.

7. The method of claim 1, wherein the preparing of the repairing solution includes:
preparing the repairing solution by adjusting molar concentration of the repairing solution according to a thickness of the defective part.

8. The method of claim 5, wherein the repairing of the oxide thin film includes:
spreading the repairing solution into the defective part through a process of spin coating, inkjet printing, spray coating, or deep coating.

* * * * *

UNITED STATES PATENT AND TRADEMARK OFFICE
CERTIFICATE OF CORRECTION

PATENT NO. : 9,978,592 B2
APPLICATION NO. : 15/096556
DATED : May 22, 2018
INVENTOR(S) : Hyun Jae Kim et al.

Page 1 of 1

It is certified that error appears in the above-identified patent and that said Letters Patent is hereby corrected as shown below:

On the Title Page (73) Assignee should read: Industry-Academic Cooperation Foundation, Yonsei University, Seoul, KR Signed and Sealed this
Thirteenth Day of August, 2019

Andrei Iancu
*Director of the United States Patent and Trademark Office*